(12) United States Patent
Koike

(10) Patent No.: US 6,657,203 B2
(45) Date of Patent: Dec. 2, 2003

(54) MISALIGNMENT INSPECTION METHOD, CHARGE BEAM EXPOSURE METHOD, AND SUBSTRATE FOR PATTERN OBSERVATION

(75) Inventor: Toru Koike, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 192 days.

(21) Appl. No.: 09/748,226

(22) Filed: Dec. 27, 2000

(65) Prior Publication Data

US 2001/0006216 A1 Jul. 5, 2001

(30) Foreign Application Priority Data

Dec. 28, 1999 (JP) ............................... 11-375041

(51) Int. Cl.$^7$ ................................. G01K 1/08
(52) U.S. Cl. ........................ 250/398; 356/401
(58) Field of Search ................ 250/310, 492.2, 250/491.1, 399; 324/751; 356/401; 358/461

(56) References Cited

U.S. PATENT DOCUMENTS 5,986,263 A * 11/1999 Hiroi et al. .................. 250/310
6,128,089 A * 10/2000 Ausschnitt et al. ......... 356/401
6,344,750 B1 * 2/2002 Lo et al. ...................... 324/751

FOREIGN PATENT DOCUMENTS

| JP | 60-192332 | 9/1985 |
| JP | 07-153673 | 6/1995 |
| JP | 11-45849 | 2/1999 |

OTHER PUBLICATIONS

Nakasugi et al.; "Pattern Observation Apparatus and Pattern Observation Method", U.S. patent application Ser. No. 09/669,732, filed on Sep. 26, 2000.

* cited by examiner

Primary Examiner—John R. Lee
Assistant Examiner—Phillip A Johnston
(74) Attorney, Agent, or Firm—Finnegan, Henderson, Farabow, Garrett & Dunner, L.L.P.

(57) ABSTRACT

A sample has a first mark and a second mark formed in a layer upper than the first mark on a Si substrate. The first and second marks are arrange such that they do not have an overlapping area in a direction in which relative positions of the first and second marks are measured. The sample is scanned with an electron beam, detecting a first scattered-electron signal from the sample on a line including the first mark, and a second scattered-electron signal from the sample on a line including the second mark. Based on the first and second scattered-electron signal, representative positions of the first and second marks are obtained, and a positional misalignment amount of the first and second marks is further obtained.

20 Claims, 11 Drawing Sheets

MISALIGNMENT INSPECTION METHOD, CHARGE BEAM EXPOSURE METHOD, AND SUBSTRATE FOR PATTERN OBSERVATION

CROSS-REFERENCE TO RELATED APPLICATIONS

This application is based upon and claims the benefit of priority from the prior Japanese Patent Application No. 11-375041, filed Dec. 28, 1999, the entire contents of which are incorporated herein by reference.

BACKGROUND OF THE INVENTION

The present invention relates to a misalignment inspection method, a charge beam exposure method, and a substrate for pattern observation, and particularly to a misalignment inspection method for a semiconductor device pattern, a charge beam exposure method, and a substrate for pattern observation.

In inspection of a lithography process in the manufacture of micro semiconductor devices, the precision of pattern dimensions and misalignment are measured. The inspection of dimensions and that of misalignment are conventionally achieved by separate devices, respectively, which result in high device costs and take a long time for the inspections.

A method using a scanning electron microscope (SEM) has been being widely used for inspection of pattern dimensions. Meanwhile, several methods using also the SEM to measure misalignment have been proposed. For example, U.S. Pat. No. 2,616,676 discloses a method in which a micro inspection mark is used to carry out simultaneously length measurement and alignment inspection. Also, Proc. SPIE 1673 pp157–164 (1992) discloses a method in which a gap structure is provided for a reference mark (first mark) on a lower layer and a second mark is formed thereof of a resist, thereby to so that a relative positional difference between both marks.

Also, in conventional techniques, the ground position is difficult to detect if a ground mark taken as a reference for misalignment measurement is flattened as a result of film formation and polishing process in the course of manufacturing process. In the case where the reference mark is flattened, the ground mark and its periphery are electrified and a potential contrast image based on the difference between their surface potentials is used under the irradiation condition that the current amount is larger and the acceleration voltage is set higher compared with a normal length. As a result, the ground mark can be measured. However, the asymmetry and peripheral structure of a mark greatly influences the charging thereby causing measurement errors in the method of applying intentionally charges to a sample. In particular, a phenomenon of excessive charge-up occurs with respect to a mark on an upper layer, leading to a problem that the relative position thereof cannot be measured correctly in relation to the ground mark.

Further, there is a further problem that offset may occur in measurement results if a beam is scanned in parallel with the misalignment measurement direction.

As described above, in the method of using a contrast image based on a difference between surface potentials in a conventional micro pattern inspection method, charges are intentionally applied so that the asymmetry and peripheral structure of a mark greatly influence the charges, thereby causing measurement errors. In particular, there is a problem that the phenomenon of excessive charge-up is caused with respect to the mark in an upper layer, so the relative position relative to a ground cannot be measured correctly. In addition, there is another problem that offset may occur in measurement results if a beam is scanned in parallel with the misalignment measurement direction.

BRIEF SUMMARY OF THE INVENTION

An object of the present invention is to provide a misalignment inspection method, a charge beam exposure method, and a substrate for pattern observation, which enable more precise misalignment inspection.

A misalignment inspection method according to the present invention is characterized by comprising: a step of scanning an area with a charge beam, the area including a part of first and second marks in a sample including the first mark and the second mark which is formed in a layer upper than the first mark and is used for measuring a relative position relative to the first mark, on a substrate, and the first and second mark being arranged so as not to have an area overlapping each other in a measurement direction in which relative positions of the first and second marks are measured; a step of detecting first charged particles from the sample on a line including the first mark; a step of detecting second charged particles from the sample on a line including the second mark; a step of obtaining representative points of the first and second marks, based on signal waveforms obtained from the first and second charged particles, respectively; and a step of calculating a positional misalignment amount of the first and second marks, based on the representative points of the first and second marks.

Another misalignment inspection method according to the present invention comprising: a step of scanning an area with a charge beam, the area including a part of first and second marks in a sample including the first mark and the second mark which is formed in a layer upper than the first mark and is used for measuring relative positions of the first and second marks, on a substrate, by operating the charge beam in a direction vertical to a measurement direction in which relative positions of the first and second marks are measured, thereby to detect charged particles and to obtain a signal waveform as a positional function; a step of respectively detecting representative positions of the first and second marks, based on the signal waveform; and a step of calculating a positional misalignment amount of the first and second marks, based on the representative positions of the first and second marks.

Preferably, a flat layer having a flat surface is formed on the substrate including the first mark, the second mark is formed on the flat layer, and the second mark is exposed from a surface of the sample.

A charge beam exposure method according to the present invention is characterized in that the scanning with the charge beam is performed by a charge beam exposure device, and position-aligned charge beam exposure is carried out on the basis of a calculated position misalignment amount of the first and second mark.

Preferably, the first and second marks are line patterns.

In the present invention, positions of first and second marks in an used sample are arranged at positions where the marks do not overlap in the direction in which misalignment measurement is performed, in case of making the misalignment inspection with use of a sample in which first and second misalignment inspection marks are respectively formed in different layers.

As a result, signal waveforms are individually obtained with respect to the first and second marks, respectively, in case of making the misalignment measurement. Therefore, inspection can be achieved with reduced influence from charge-up of the second mark, which will be caused in case that scanning is performed in one single direction. Accordingly, misalignment inspection can be achieved with higher precision.

Also, in the present invention, signal waveforms are obtained by scanning with a charge beam in a direction vertical to the misalignment measurement direction. Accordingly, inspection can be achieved without influences from offset which will be caused in the case where the scanning direction of the charge beam overlaps the misalignment measurement direction. Accordingly, more precise misalignment inspection can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be explained with reference to the drawings.

First Embodiment

FIGS. 1A to 8B are explanatory views for a misalignment inspection method according to the first embodiment of the present invention.

FIGS. 1A, 1B, 2A and 2B are views showing a process of forming a sample used for misalignment inspection according to the present embodiment. with reference to these figures, explanation will now be made of a process of forming a mark used in the misalignment inspection.

Figure 1A:
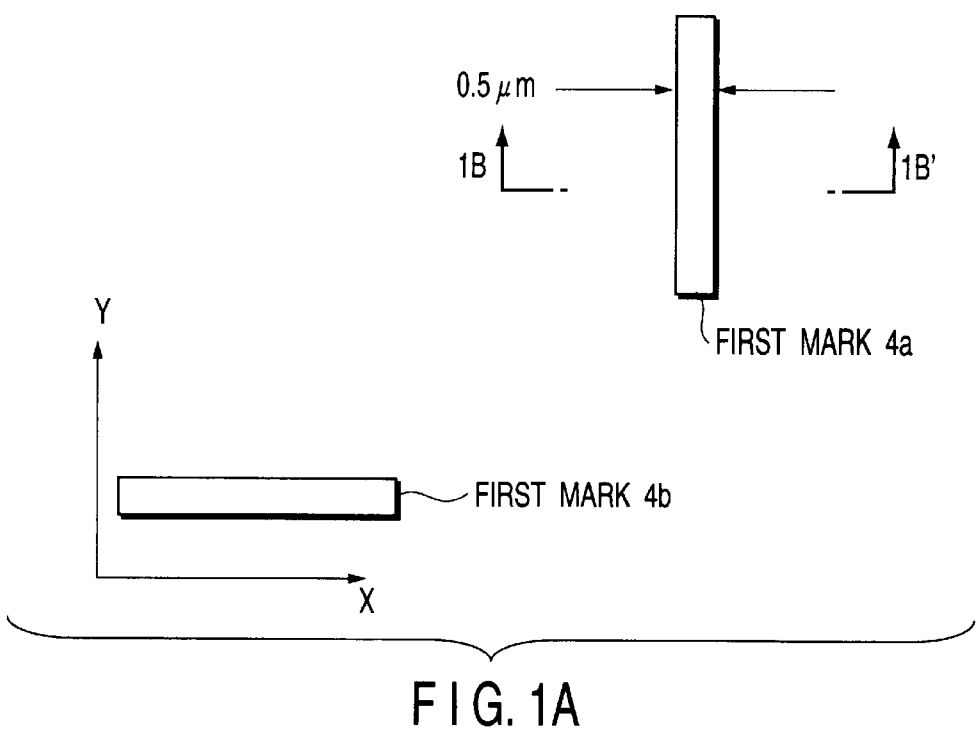
FIGS. 1A and 1B are views showing a step of forming a sample used for misalignment inspection according to the first embodiment of the present invention.
Figure 1B:
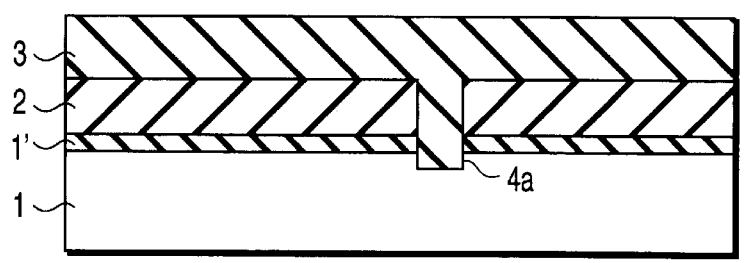

At first, as shown in FIGS. 1A and 1B, a $SiO_2$ layer 1' and a SiN layer 2 are formed on a Si substrate 1. These $SiO_2$ layer 1' and SiN layer 2 are patterned into lines by a lithography technique until the Si substrate 1 is exposed. First marks 4a and 4b made of concave portions are formed. Further, a TEOS (tetra-ethoxy-silane) layer 3 is formed on the SiN layer 2 where the concave portions are formed. The surface of the TEOS layer 3 is flattened by a CMP method.

FIG. 1A is plan view of the first marks 4a and 4b. FIG. 1B is a cross-sectional view cut along the line A–A' thereof. As shown in FIG. 1B, a gap of 250 nm existing in a sample is flattened by a successive step of forming an oxide film with a film thickness of 300 nm. The structures of the first marks 4a and 4b are formed simultaneously in a step of forming the device structure in a chip, and are normally arranged at the periphery of the chip.

Also, the marks 4a and 4b in FIG. 1A are patterns like lines and serve also to help measurement of misalignment in the directions vertical to their longitudinal directions. The mark 4a helps measurement of misalignment in the X-axis direction in the figure and is arranged such that the longitudinal direction thereof is parallel to the Y-axis direction. Also, the mark 4b helps measurement of misalignment in the Y-axis direction and is arranged such that the longitudinal direction thereof is parallel to the X-axis.

Figure 2A:
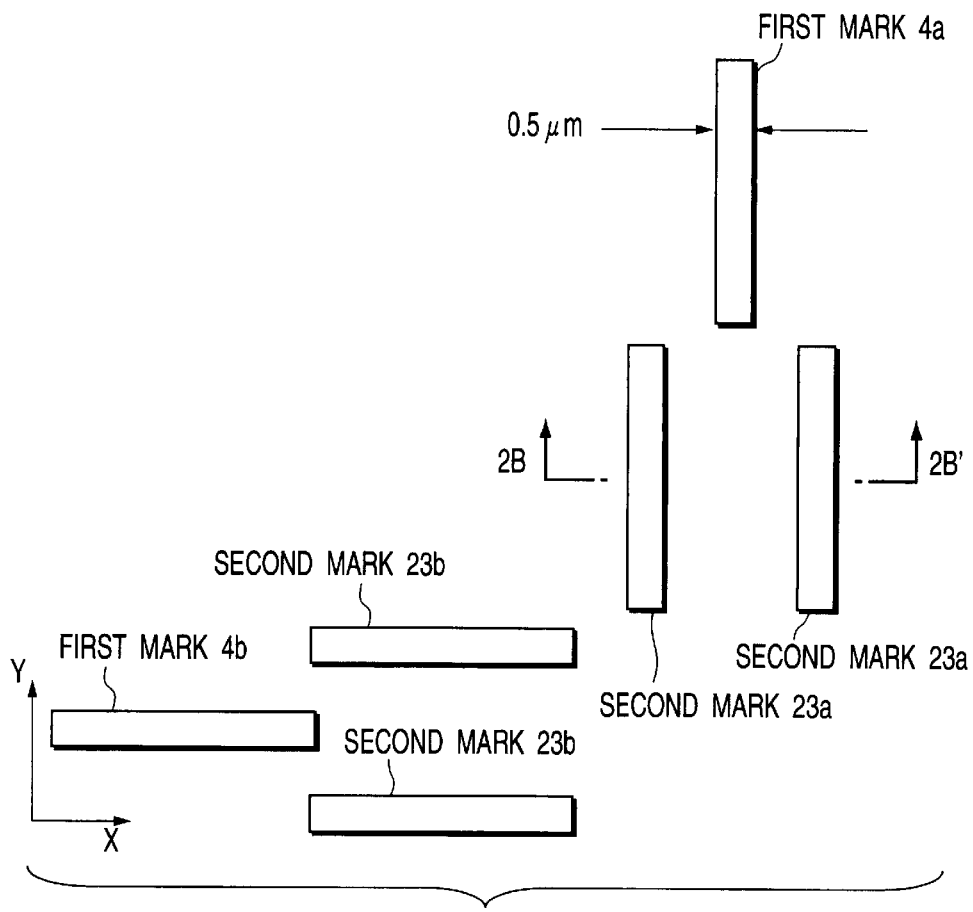
FIGS. 2A and 2B are views showing a step of forming a sample used for misalignment inspection according to the embodiment of the present invention.
Figure 2B:
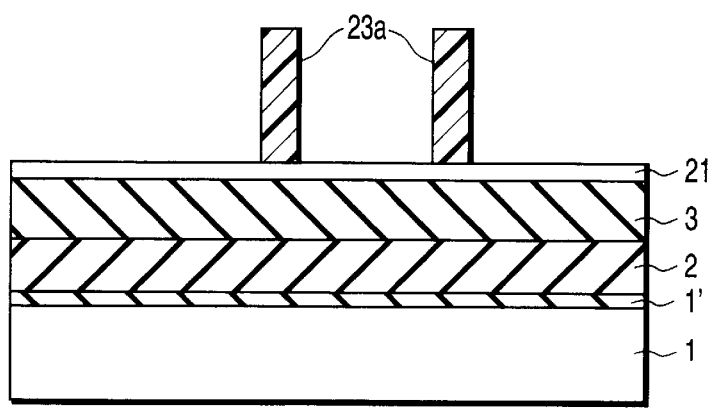

Subsequently, as shown in FIG. 2B, an anti-reflection film 21 is coated on the sample structured as described above. Thereafter, photoresist is further coated on the anti-reflection film 21. Subsequently, the photoresist is patterned into lines by a lithography step, to form a resist pattern. Second marks 23a and 23b are formed by the remaining photoresist pattern. FIG. 2A is a plan view of the sample and FIG. 2B shows a cross-sectional structure cut along the line B–B' thereof.

The second marks 23a help measurement of misalignment in the X-axis direction and are total two line patterns arranged such that the longitudinal directions of the line patterns are parallel to the Y-axis direction. Also, these two line patterns are parallel to each other and their edge portions that define their line lengths are situated at an equal position in the Y-axis direction.

The second marks 23b help measurement of misalignment in the Y-axis direction and are total two line patterns arranged such that the longitudinal directions of the line patterns are parallel to the X-axis direction. Also, these two line patterns are parallel to each other and their edge portions that define their line lengths are situated at an equal position in the X-axis direction.

The first marks 4a and 4b and the second marks 23a and 23b are arranged such that they do not overlap each other in the alignment measurement directions. The marks that help alignment measurement in the X-axis direction are the first mark 4a and the second marks 23a. These marks 4a and 23a are arranged so as not to overlap each other in the X-axis direction. Therefore, the Y-coordinates of the first mark 4a and second marks 23a do not overlap each other. Similarly, the marks that help alignment measurement in the Y-axis direction are the first mark 4b and the second marks 23b whose X-coordinates do not overlap.

Figure 3:
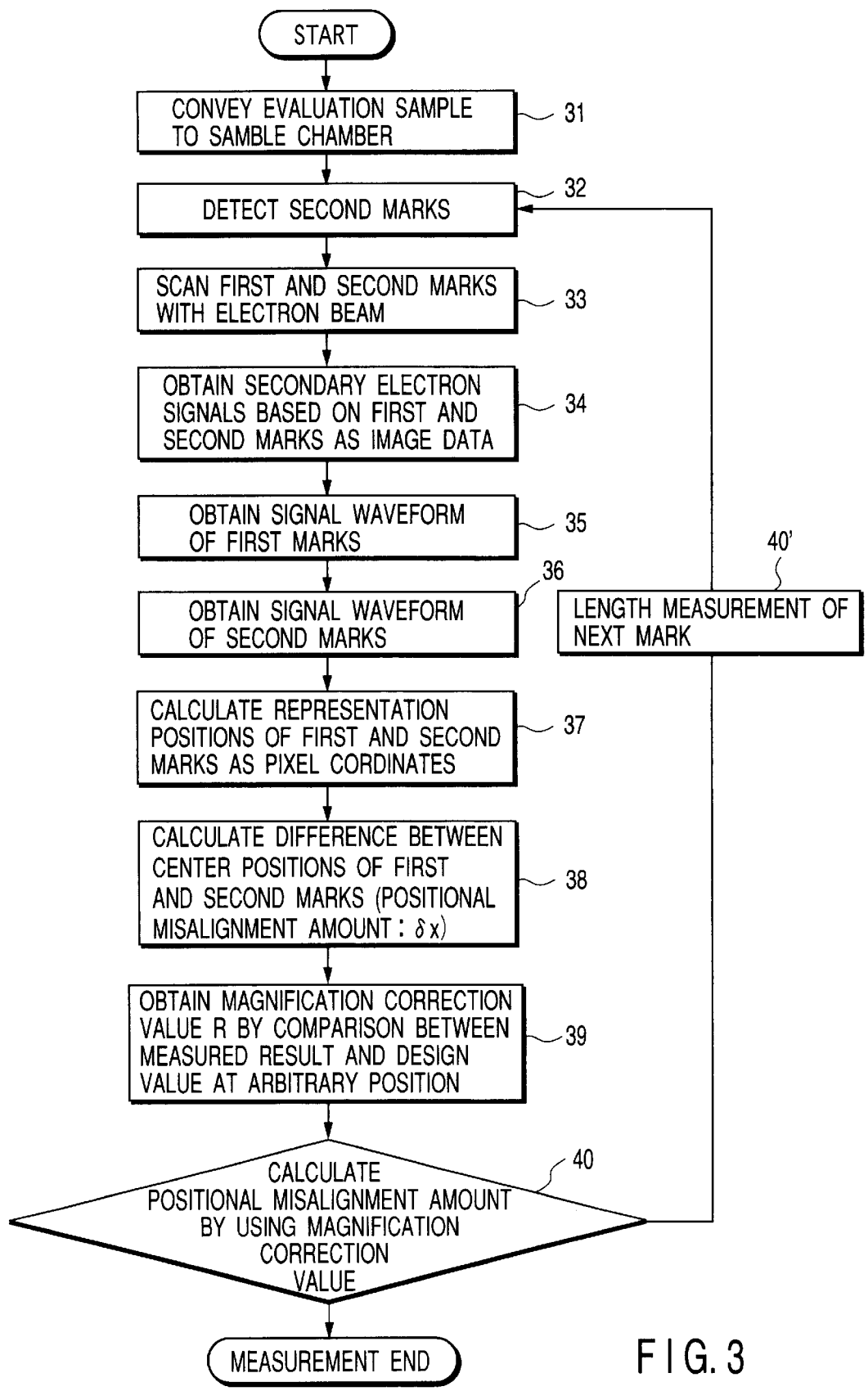
FIG. 3 shows a flowchart of misalignment inspection according to the embodiment.

Next, the misalignment inspection method according to the present embodiment will be explained with reference to the flowchart shown in FIG. 3.

At first, a sample made of a silicon wafer on which alignment marks are formed through the steps shown in FIGS. 1A, 1B, 2A and 2B is conveyed into a sample chamber of a length measurement SEM (CD SEM) (31). Further, in the same manner as that taken to observe a sample or measure a length of the sample, the positions of second marks 23a are detected (32), and misalignment inspection marks (4a and 23a) are moved to be set on the axis of an electron-beam optical system.

Figure 4:
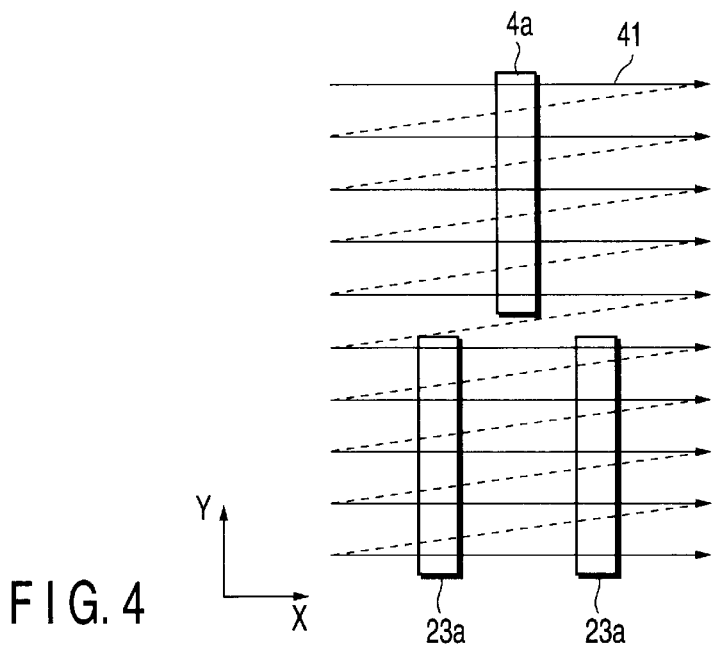
FIG. 4 is a view showing scanning tracks of an electron beam according to the embodiment.

Next, the acceleration voltage and the sample current are respectively set to 1900V and 4.0 pA. Further, the scanning frequency of the electron beam is set to 6.4 kHz, and the area including the first and second marks 4a and 23a are scanned with an electron beam (33). FIG. 4 is a view showing the scanning track of the electron beam. As can be seen from the scanning track 41 indicated by continuous lines in FIG. 4, the electron beam is operated to scan in only one direction (X-axis direction) vertical to the line-length directions of the first and second marks 4a and 23a. In other words, this scanning is carried out in parallel to the misalignment measurement direction (X-axis direction). The track indicated by broken lines teaches a track while the irradiation position is shifted, i.e., while no electron beam is irradiated.

Next, secondary electrons obtained by the electron beam scanning are detected by the SEM so that image data containing the first and second marks 4a and 23a is obtained (34).

Figure 5A:
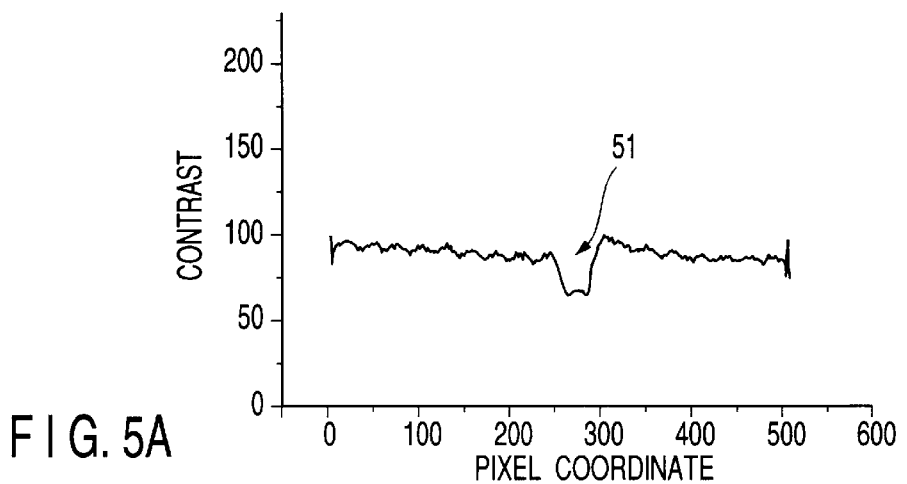
FIGS. 5A and 5B are graphs showing secondary electron signal waveforms of marks according to the embodiment.

Further, a line 42 which crosses the first mark 4a in the direction vertical to the line length direction is decided from the obtained data, thereby to obtain a signal waveform of a secondary electron signal on the line 42 (35). FIG. 5A shows the signal waveform of the secondary electron signal with respect to the first mark 4a. In the figure, the lateral axis represents the position (pixel coordinate) in the X-axis direction, and the longitudinal axis represents the contrast. In the signal waveform which has substantially constant contrast with respect to the X-axis direction, the part where the contrast is greatly decreased indicates the first mark 4a, denoted at 51 in the figure.

Figure 5B:
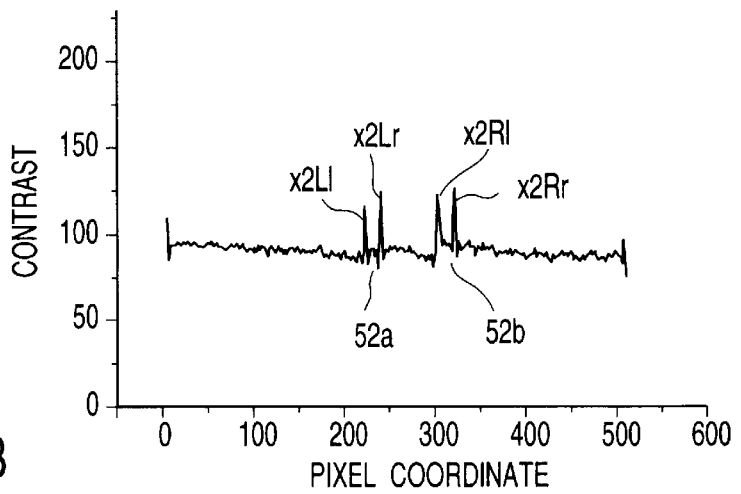

Similarly, a line 43 which crosses the second marks 23a in the direction vertical to the line length direction is decided, and a signal waveform of the secondary electron signal on the line is obtained (36). FIG. 5B shows the obtained signal waveform of the secondary electron signal with respect to the second marks 23a. The lateral and longitudinal axes in this figure represent the same as those in FIG. 5A. In FIG. 5B, the parts denoted at 52a and 52b indicate the second marks 23a, and the part where the contrast is greatly increased indicates the edge portions of the second marks 23a in the line width direction.

Next, representative positions of the first and second marks 4a and 23a are decided, based on the signal waveforms obtained respectively for the first and second marks 4a and 23a (37), in the manner as will described below.

At first, in the secondary electron signal waveforms, the part denoted at 51 in FIG. 5A indicates the position of the first mark 4a. The vicinity of the arrowed part 51 is approximated to a high-dimensional function, and a center position X1 is decided from extreme values thereof.

On the other hand, in the secondary electron signal waveforms, the vicinities of the parts 52a and 52b indicate the positions of the second marks 23a. As can be seen from FIG. 5B, sharp peaks appear at pattern edge portions, reflecting the three-dimensional shapes of the patterns. Hence, the peak positions are obtained in both sides of the marks and are taken as representative positions x2Ll, x2Lr, x2Rl, and x2Rr.

Next, a center position of the second marks 23a is calculated by the following expression, based on the representative positions x2Ll, x2Lr, x2Rl, and x2Rr.

$$X2=(x2Ll+x2Lr+x2Rl+x2Rr)/4$$

Next, a difference between the center position X1 of the first mark 4a and the center position of the second marks 23a is calculated as a relative positional misalignment value δxA in the X-axis direction (38).

Next, the value of x2Rl−x2Ll or x2Rr−x2Lr is compared with a design value, thereby to determine a coefficient R (magnification correction value R) for magnification correction (39).

At last, δxA is multiplied by the magnification correction value R, thereby to express the positional misalignment amount as a dimensional distance (40). The following expression is given where δx is the positional misalignment amount expressed as a dimensional distance.

$$δx=R×δxA$$

Misalignment measurement in the X-axis direction is completed in the procedure as described above. Further, the same procedure is repeated with respect to the first and second marks 4b and 23b (40'), to obtain a positional misalignment amount with respect to the Y-axis direction.

The positional misalignment amounts δx and δy are thus obtained with respect to both the X- and Y-axis directions, and then, all of the measurement ends.

Figure 6A:
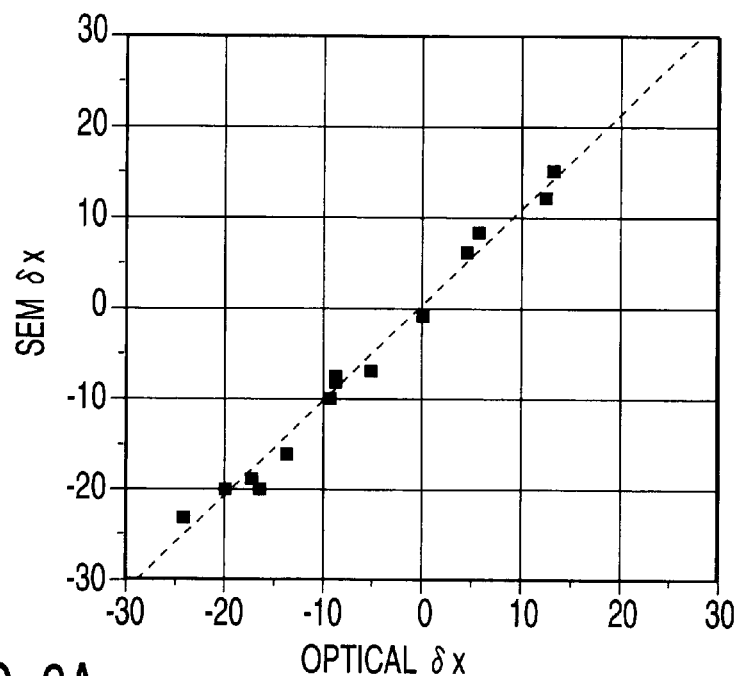
FIGS. 6A and 6B are graphs showing inspection results based on a mark inspection method according to the embodiment and those of optical inspection compared with each other.
Figure 6B:
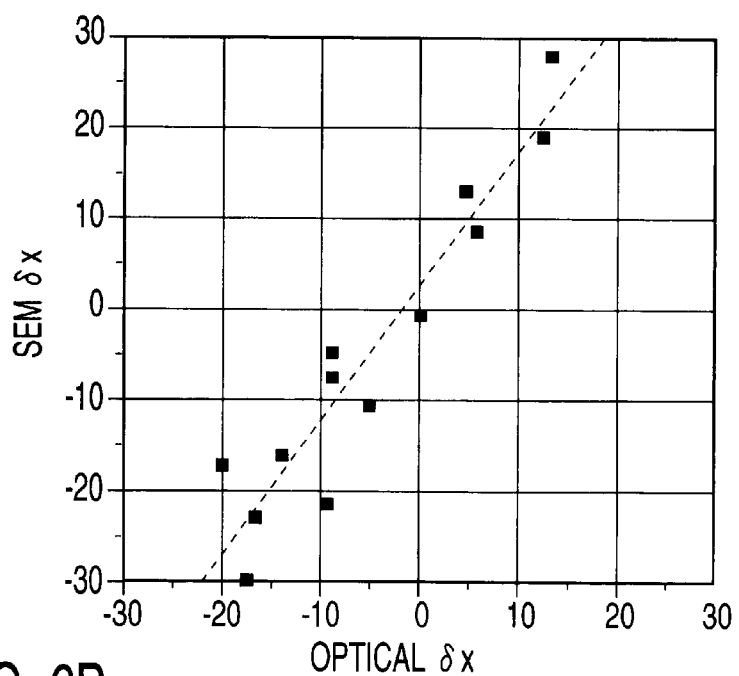

Positional misalignment amounts obtained in the procedure as described above were compared with results of an inspection using a normal optical microscope. FIG. 6A shows results of the comparison. FIG. 6B shows results of comparing the amounts with results of an inspection using a conventional CD SEM, for comparison. In each of these figures, the lateral axis represents a positional misalignment amount (optical δx) obtained from the optical inspection results, and the longitudinal axis represents a positional misalignment amount (SEM δx) obtained from the results using a CD SEM.

A conventional method concerning FIG. 6B is as follows.

Figure 7A:
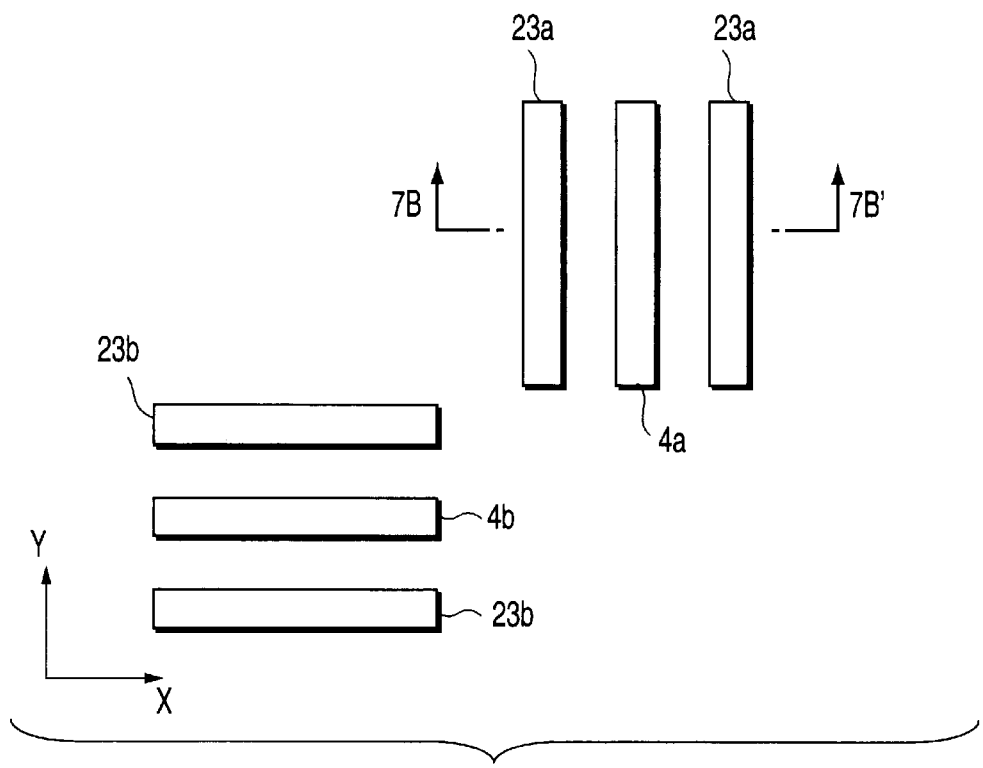
FIGS. 7A and 7B are views showing the entire structure of a sample used for misalignment inspection for comparison with the embodiment.
Figure 7B:
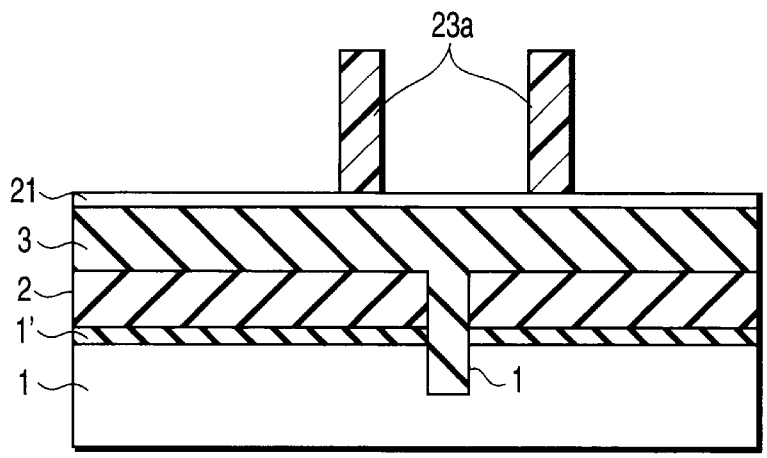

The structures of the first marks 4a and 4b are the same as those in the case of the present embodiment shown in FIGS. 1A and 1B. However, the positions of the second marks 23a and 23b relative to the first marks 4a and 4b are different from those of the present embodiment. FIG. 7A is a plan view showing the entire structure of a sample used for this conventional inspection method, and FIG. 7B is a cross-sectional view cut along the line C–C' thereof. As shown in FIGS. 7A and 7B, the first marks 4a and 4b and the second marks 23a and 23b are arranged so as to overlap each other in the misalignment measurement directions. As can be seen from comparison between the cross-sectional views of FIGS. 7B and 2B, the first mark 4a and the second marks 23a have overlapped Y-coordinates in the cross-sections cut along the X-axis direction. These marks are flattened through the step of forming the oxide film having a film thickness of 300 nm in which gaps of 250 nm continue, dispersed in the sample. The structures of the first marks 4a and 4b are formed simultaneously in a step of forming a device structure in a chip and are normally arranged in the periphery of the chip.

Figure 8A:
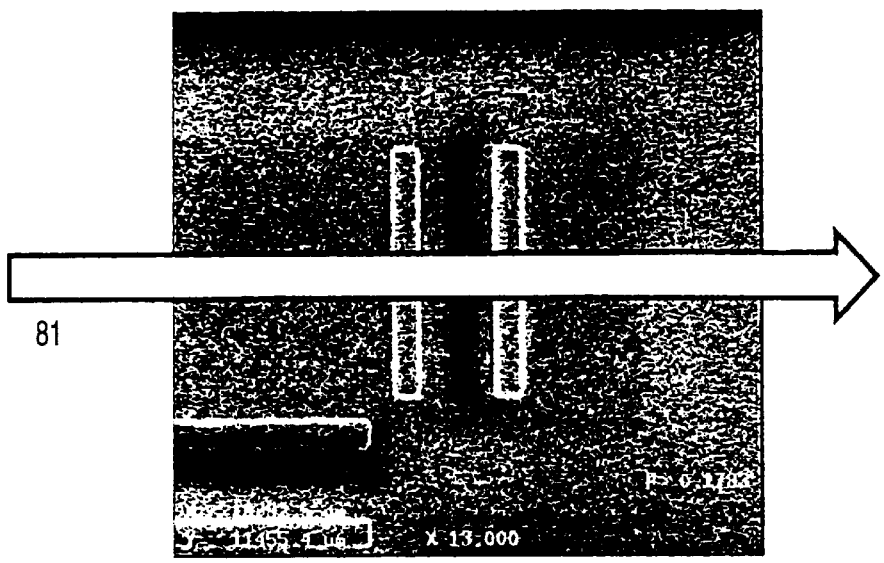
FIGS. 8A and 8B are a view and a graph showing image data and a profile obtained by misalignment inspection made for comparison with the embodiment.
Figure 8B:
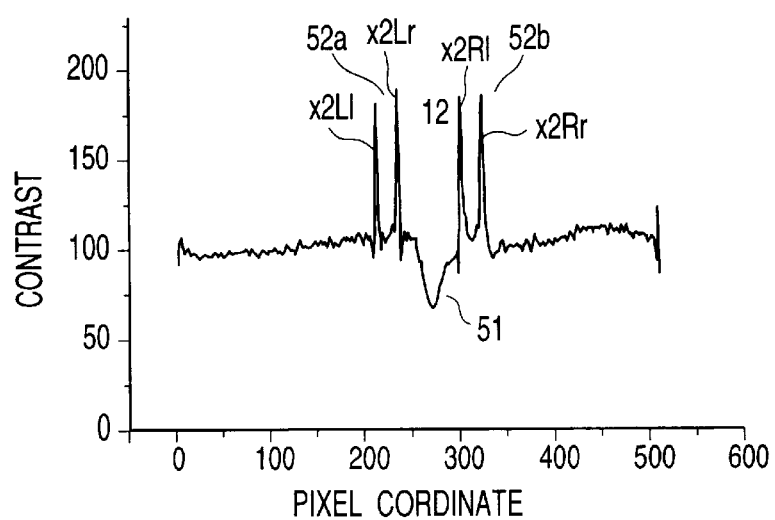
Figure 9:
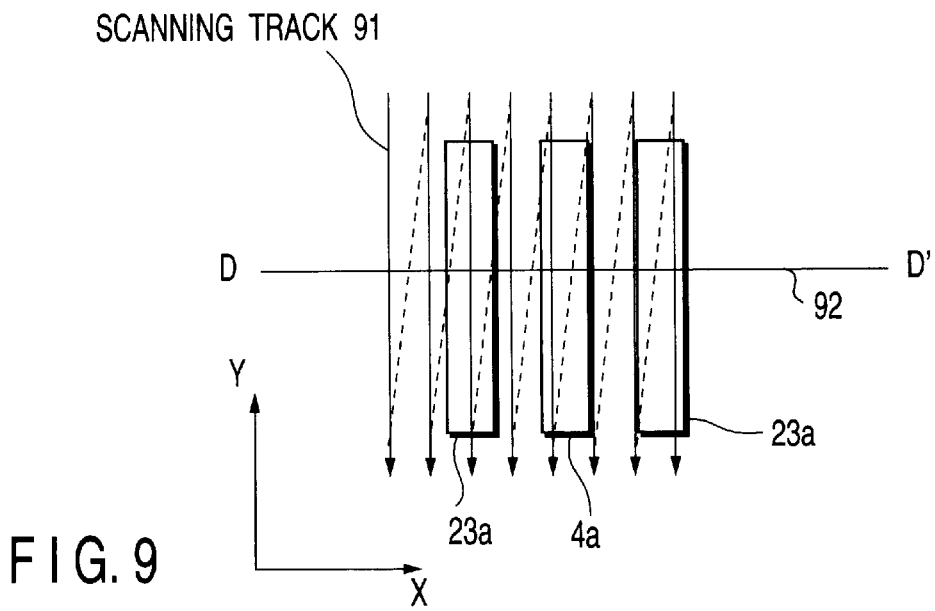
FIG. 9 is a view showing scanning tracks of an electron beam according to the second embodiment of the present invention.

FIG. 8A shows image data obtained by performing electron-beam scanning similar to that of the present embodiment with use of the sample as described above. FIG. 8B shows a signal waveform of secondary electrons obtained from the obtained data. In FIG. 8A, the reference symbol 81 indicates an area where the signal waveform is obtained. A difference from the present embodiment is that the signal waveforms of the first mark 4a and second marks 23a are obtained simultaneously on one line. Signal processing similar to that of the present embodiment was performed on the signal waveforms thus obtained, and obtained positional misalignment amounts were compared with inspection results of an optical microscope. The results of the comparison are shown in FIG. 6B. This figure teaches that a more excellent relationship is obtained as measurement results which are closer to the line shown in figure.

As can be understood from the plotted dots on FIG. 6B, the results of the conventional inspection and those of the optical microscope include wide variants. In addition, the line to which these inspection results are approximated is quite different from 1 although the line to which these inspection results are approximated should ideally have an inclination of 1. In contrast, where the inspection results of the present embodiment and those of the optical microscope are compared with each other, plotted dots substantially exist on an approximation line and variants are reduced. Also, the approximation line substantially has an inclination of 1, so that substantially the same results as those of the optical microscope are obtained. It is hence found that the inspection results (FIG. 6A) of the present embodiment attain very excellent correlation with the inspection results of the optical inspection results, compared with the inspection results (FIG. 6B) of using a conventional CD SEM.

It is considered that variants thus appear in the results of the conventional inspection because the second marks 23a and 23d exposed on the flat TEOS layer 3 are charged up in the conventional method thereby changing the course of the scanning electron beam and influencing the measurement results. This influence is found to be conspicuous in case of a large misalignment amount. Accordingly, inspection can be achieved with influences from the charge-up reduced, if the first and second marks are positioned so as not to overlap each other with respect to the misalignment measurement directions and signal waveforms are obtained from the first and second marks, as in the present embodiment. Therefore, misalignment measurement can be achieved with higher precision.

In the embodiment described above, electron beams for obtaining images of the first and second marks are operated to scan in parallel with the measurement alignment directions but need not always be parallel therewith. A predetermined angle may be maintained between the electron beam scanning directions and the misalignment measurement directions.

Also, each electron beam is operated to scan overlapping substantially the entire first and second marks but is not limited thereto. Of course, the scanning area may be a part of the first and second marks and irradiation may be repeated at same positions in directions vertical to the line length directions of the marks.

In addition, for example, maximum and minimum values may be calculated in the vicinity of a peak, and an intermediate value which is an intermediate value between the maximum and minimum values may be taken as a peak position.

Although one line pattern is provided as the first mark 4a in misalignment measurement in one direction, the first mark 4a is not limited thereto. For example, two line patterns may be used for misalignment measurement in one direction, like the second marks 23a.

Figure 13:
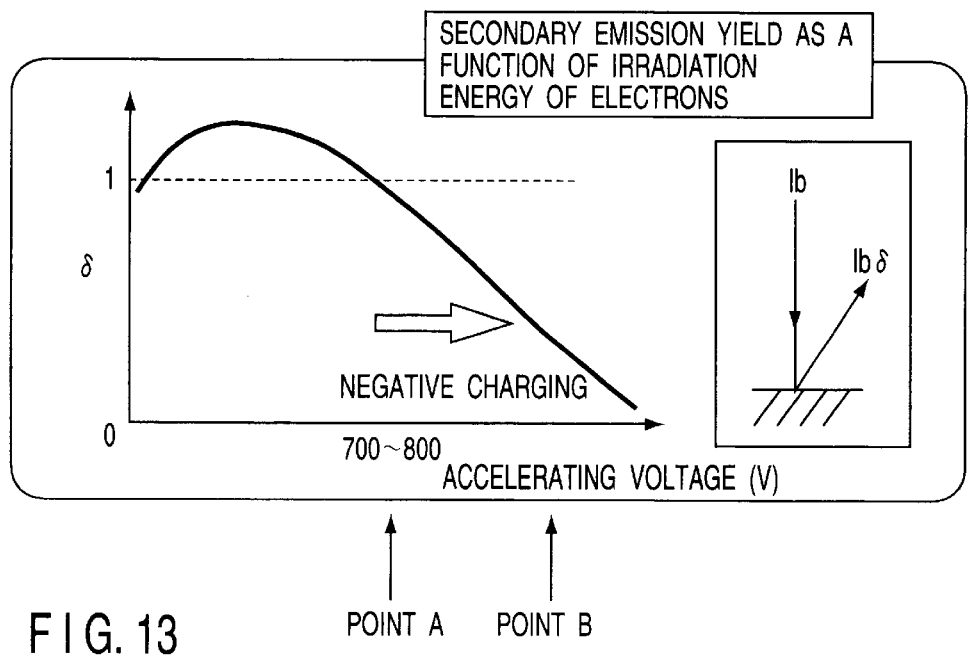
FIG. 13 is a view showing a relationship between the acceleration voltage of an electron beam to a sample and the secondary electron emission efficiency.

In the present embodiment, measurement is carried out with the acceleration voltage of the electron beams set to 1900 V. The acceleration voltage, however, is not limited thereto. Any acceleration voltage may be used in the present embodiment as long as the sample surface can be electrified. FIG. 13 is a view showing the relationship between the acceleration voltage of the electron beams to a sample and the emission efficiency of secondary electrons from the sample surface. As shown in the frame of FIG. 13, charging of the sample surface is determined by the ratio δ between an electron beam amount (Ib) incident to a sample and the secondary electron amount (Ibδ) emitted from the sample surface.

In case of δ=1, i.e., in case where the secondary electron emission efficiency is 1, the amount of the electron beam incident to the sample and the amount of the secondary electrons are equal to each other, so that the sample surface is not charged.

In contrast, where δ>1 is given, the amount of secondary electrons emitted from the sample surface is greater than the amount of electrons which enter into the sample surface. Therefore, the sample surface is positively charged. This state is equivalent to an acceleration voltage of several tens V to 700 or 800 V, for example, in the example shown in FIG. 13.

Where δ<1 is given, the amount of electrons incident to the sample surface is greater than the amount of secondary electrons emitted from the sample surface. Accordingly, the sample surface is charged negatively. This state is equivalent to several tens V or less or 700 or 800 V or more, for example, in case of the example shown in FIG. 13.

In case of the acceleration voltage of 1900 V used in the present embodiment, the sample surface is sufficiently charged negatively. As a result, even a mark formed at a deep position from the sample surface can be detected sufficiently.

Figures 14A, 14B:
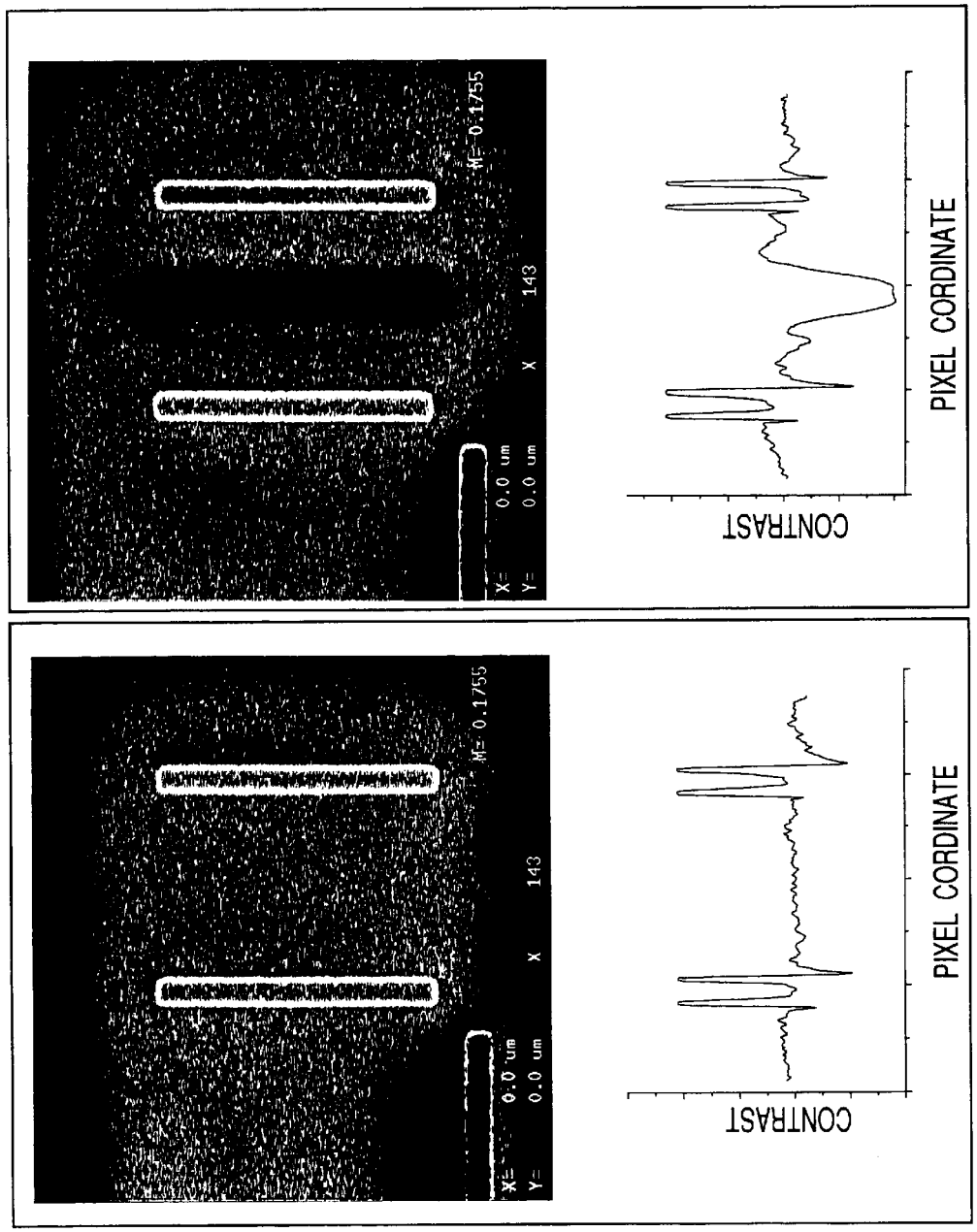
FIGS. 14A and 14B are views and graphs showing images of surfaces and profiles of a sample observed with different acceleration voltages.

FIG. 14A shows an image and a profile which are obtained in case of using the sample shown in FIGS. 7A and 7B as samples. FIG. 14B shows an image and a profile which are obtained in case where the acceleration voltage is set to 1900 V. As shown in FIG. 14A, a mark formed at a deep position from the sample surface cannot substantially be observed and does not substantially appear on the profile where the acceleration voltage is 800 V, i.e., where δ≈1. In contrast, marks including one formed at a deep position from the sample surface can be observed and appear sufficiently on the profile, where the acceleration voltage is 1900 V, i.e., where δ<1, as shown in FIG. 14B. By thus selecting an acceleration voltage having δ which is not 1, relative positional misalignment measurement can be achieved. Thus, the relationship between the secondary electron emission efficiency and the image data and profile obtained also applies not only to FIGS. 7A and 7B but also to the case of using the sample shown in FIGS. 1A to 2B. Although explanation has been made of the case of making misalignment measurement by selecting an acceleration voltage which gives δ<1, misalignment measurement can naturally be achieved by selecting an acceleration voltage which gives δ>1.

Note that FIG. 13 shows only an example of the relationship curve and the acceleration voltage that gives δ=1 can vary variously depending on the device structure, the material of the sample, and the like.

Second Embodiment

FIGS. 9 to 11B are explanatory views for a misalignment inspection method according to the second embodiment of the present invention. The present embodiment is characterized in that the scanning direction of the electron beam is set in the direction vertical to the direction in which misalignment measurement is carried out. Therefore, not only the mark positions shown in the first embodiment but also those shown in FIGS. 7A and 7B are applicable as positions of marks formed on a sample in the present invention. The present embodiment will now be explained with reference to a case as an example of using the sample shown in FIGS. 7A and 7B. Note that elements common to the first embodiment are denoted at common reference symbols, and detailed explanation thereof will be omitted herefrom.

The sample shown in FIGS. 7A and 7B is conveyed into a sample chamber of a CD SEM. Further, in the same manner as that taken to observe a sample or measure ordinarily a length of the sample, the positions of misalignment inspection second marks 23$a$ are detected, and misalignment inspection marks (4$a$ and 23$a$) are moved to be set on the axis of an electron-beam optical system.

Next, the acceleration voltage and the sample current are respectively set to 1900V and 4.0 pA. Further, the scanning frequency of the electron beam is set to 6.4 kHz, and the area including the first and second marks 4$a$ and 23$a$ are scanned with the electron beam. As can be seen from the scanning track 91 indicated by continuous lines in FIG. 9, the electron beam is operated to scan in only one direction parallel to the line-length directions of the first and second marks 4$a$ and 23$a$. In other words, this scanning is carried out vertically to the misalignment measurement direction. Note that the track indicated by broken lines teaches a track while the irradiation position is shifted, i.e., while no electron beam is irradiated.

Next, secondary electrons obtained by the electron beam scanning are detected by the SEM so that image data containing the first and second marks 4$a$ and 23$a$ is obtained.

Figure 10:
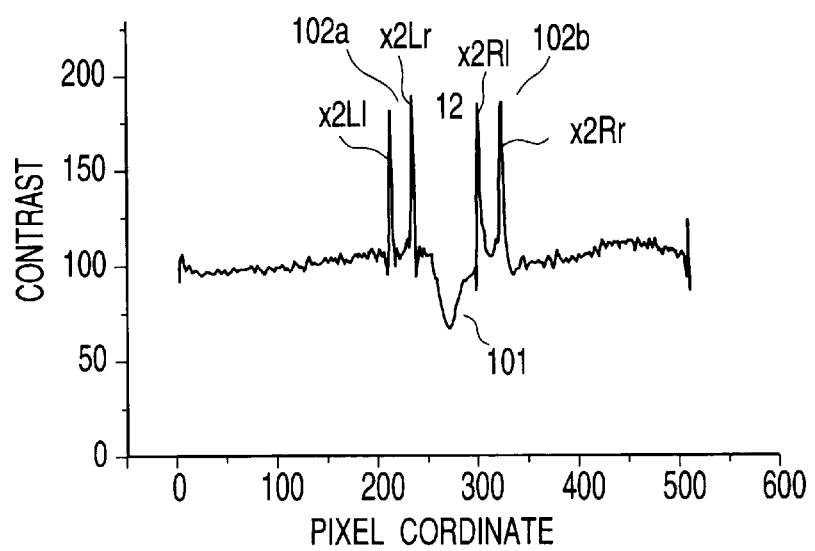
FIG. 10 is a graph showing a secondary electron signal waveform of marks according to the embodiment.

Further, a line 92 which crosses both the first mark 4$a$ and the second marks 23$a$ in the direction vertical to the line length directions thereof is decided from the obtained data, thereby to obtain a signal waveform of a secondary electron signal on the line 92. FIG. 10 shows the signal waveform of the secondary electron signal with respect to the first mark 4$a$ and the second marks 23$a$. In the figure, the lateral axis represents the position (pixel coordinate) in the X-axis direction, and the longitudinal axis represents contrast. In the signal waveform which has substantially constant contrast with respect to the X-axis direction, the part where the contrast in the vicinity of the position having a pixel-coordinate of 250 is greatly decreased indicates the first mark 4$a$, denoted at 101 in the figure.

Likewise, the parts denoted at 102$a$ and 102$b$ indicate the second marks 23$a$, and the part where the contrast is greatly increased indicates the edge portions of the second marks 23$a$ in the line width direction.

Next, representative positions of the first and second marks 4$a$ and 23$a$ are decided, based on the signal waveforms obtained respectively for the first and second marks 4$a$ and 23$a$, in the manner as will be described below.

At first, in the secondary electron signal waveforms, the part denoted at 101 in FIG. 10 indicates the position of the first mark 4$a$. The vicinity of the arrowed part 101 is approximated to a high-dimensional function, and a center position X1 of the mark is decided from extreme values thereof.

On the other hand, in the secondary electron signal waveforms, the vicinities of the parts 102$a$ and 102$b$ indicate the positions of the second marks 23$a$. As can be seen from FIG. 10, sharp peaks appear at pattern edge portions, reflecting the three-dimensional shapes of the patterns. Hence, the peak positions are obtained in both sides of the marks and are taken as representative positions x2Ll, x2Lr, x2Rl, and x2Rr.

Next, a center position of the second marks 23$a$ is calculated by the following expression, based on the representative positions x2Ll, x2Lr, x2Rl, and x2Rr.

$$X2=(x2Ll+x2Lr+x2Rl+x2Rr)/4$$

Next, a difference between the center position X1 of the first mark 4$a$ and the center position x2 of the second marks 23$a$ is calculated as a relative positional misalignment value δxA in the X-axis direction.

Next, the value of x2Rl−x2Ll or x2Rr−x2Lr is compared with a design value, thereby to determine a coefficient R (magnification correction value R) for magnification correction.

At last, δxA is multiplied by the magnification correction value R, thereby to express the positional misalignment amount as a dimensional distance. The following expression is given where δx is the positional misalignment amount expressed as a dimensional distance.

$$\delta x = R \times \delta xA$$

Misalignment measurement in the X-axis direction is completed in the procedure as described above. Further, the same procedure is repeated with respect to the first and second marks 4$b$ and 23$b$, to obtain a positional misalignment amount with respect to the Y-axis direction.

The positional misalignment amounts δx and δy are thus obtained with respect to both the X- and Y-axis directions, and then, all of the measurement ends.

Figure 11A:
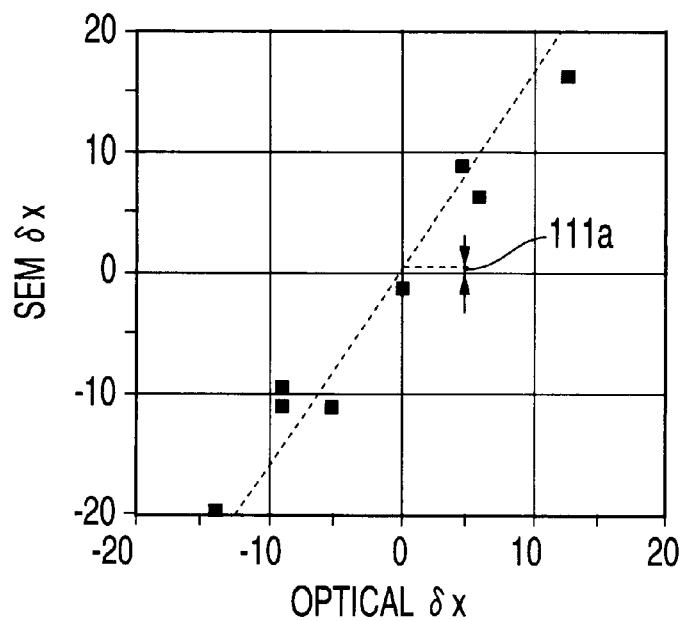
FIGS. 11A and 11B are graphs showing inspection results based on a mark inspection method according to the embodiment and those of optical inspection compared with each other.
Figure 11B:
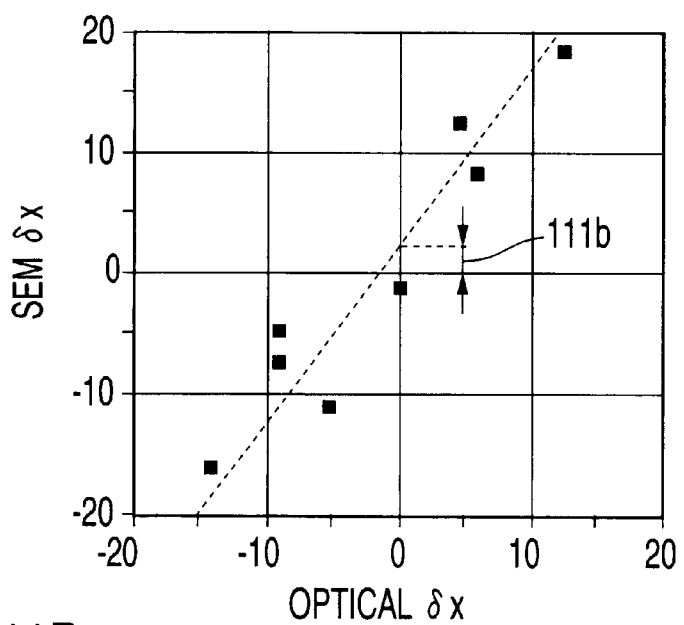

Positional misalignment amounts obtained in the procedure as described above were compared with results of an inspection using a normal optical microscope. FIG. 11A shows results of the comparison. FIG. 11B shows results of comparing the amounts with results of an inspection using conventional CD SEM, for comparison. In each of these figures, the lateral axis represents a positional misalignment amount (optical δx) obtained from the optical inspection results, and the longitudinal axis represents a positional misalignment amount (SEM δx) obtained from the results using a CD SEM. The conventional inspection method used for calculating the results of FIG. 11B adopts substantially the same method and conditions as those of the present embodiment except the scanning direction of the electron beam for obtaining the secondary electron signal. While the scanning direction is vertical to the misalignment measurement direction in the present embodiment, the scanning direction is parallel to the misalignment measurement direction in the conventional inspection method concerning FIG. 11B.

As shown in FIG. 11B, the positional misalignment amount of the inspection results based on the SEM in the case where the positional misalignment is δx=0 in the optical inspection results, i.e., the SEM δx (a sectional value 111a) at a cross point between the Optical δx and an approximation line of the inspection results in the figure is about 3.0 nm. In contrast, in the inspection results shown in FIG. 11A, the corresponding value (a sectional value 111b) is about 0.6 nm.

The sectional value defined herein expresses an offset due to the measurement method. That is, where the optical inspection is considered as an ideal inspection method, the results of the SEM inspection should come closer to the optical inspection results of the SEM inspection is more ideal. Therefore, the approximation line passes through the origin in an ideal case. However, if the measurement results are deviated in one direction, the approximation line tends to be apart from the origin. Accordingly, whether the ideal results or not can be determined by checking a sectional value as a deviation from the origin. A factor which deviates the measurement results is considered to be the scanning method of the electron beam when obtaining secondary electron signals of marks. That is, it is considered that secondary electrons are deviated if an electron beam is operated to scan in the same direction as that in which misalignment is measured.

In this respect, influence of the beam scanning on measurement can be eliminated by setting the electron beams scanning direction vertical to the misalignment measurement direction like the present embodiment. Therefore, measurement offsets are eliminated so that misalignment inspection can be achieved with higher precision.

Third Embodiment

The present embodiment relates to a modification example of the first embodiment. The present embodiment uses a charge beam scanning method which is different from that of the first embodiment. Note that those elements that are not especially explained in the present embodiment are common to those of the first embodiment and detailed explanation thereof will be omitted herefrom.

Figure 12A:
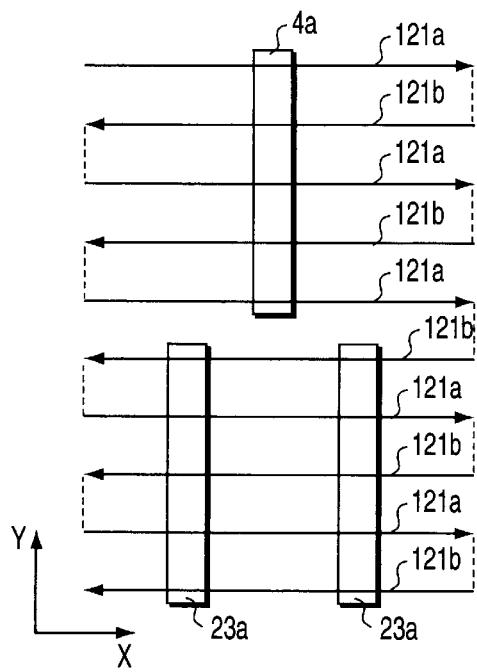
FIGS. 12A and 12B are views showing scanning tracks of an electron beam according to the third embodiment of the present invention.

FIG. 12A is a view showing a first charge beam scanning method according to the present embodiment. As shown in FIG. 12A, reference symbols 121a and 121b denote scanning tracks of charge beams to a sample on which a first mark 4a and second marks 23a are formed. The scanning tracks 121a and 121b are obtained by beam scanning in one same direction. In addition, the scanning track 121a is obtained by beam scanning in the positive direction of the X-axis, while the scanning track 121b is obtained by beam scanning in the negative direction of the X-axis.

Thus, scanning tracks are drawn on the sample surface by scanning adjacent areas in opposite directions, respectively. Therefore, uniformity of charging is assured in the X-axis direction on the sample surface, compared with the case of FIG. 4 in which scanning tracks are drawn in one direction. As a result, generation of an asymmetric signal waveform due to the scanning direction is reduced, so that deviation of the profile of the sample in the X-axis direction, which is obtained by detection of secondary electrons, can be reduced.

That is, in case where secondary electrons are detected by scanning in one direction, a charging error is caused between the upstream side and downstream side of the scanning because the scanning direction is set constant. However, the charging error can be reduced if scanning is carried out with scanning directions thus opposed.

Figure 12B:
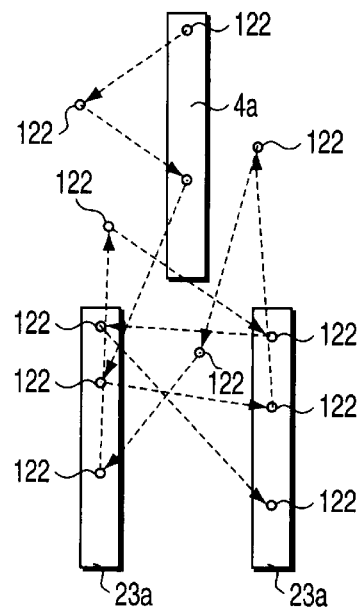

FIG. 12B is a view showing a second charge beam scanning method according to the present embodiment. In FIG. 12B, the reference symbol 122 denotes a scanning track of a charge beam with respect to a sample on which a first mark 4a and second marks 23a are formed. As can be seen from FIG. 12B, the scanning track is obtained by a dot-like beam as the charge beam having an irradiation area which is far smaller than the sample surface.

This dot-like beam scanning is executed on the base of scanning information constructed by irradiation positions and irradiation order. More specifically, a dot-like beam is irradiated on random irradiation positions on the sample surface in a random irradiation order. In this manner, the scanning track 122 is obtained.

As a result, non-uniformity of charging which depends on the scanning direction can be reduced, so that generation of an asymmetric signal waveform caused by the scanning direction can be reduced and a more precise profile of sample can be obtained.

More preferably, detection of secondary electrons obtained by the beam scanning shown in FIG. 12B should be obtained also in a dot-like manner. In this respect, scanning information constructed by irradiation positions and irradiation order is previously stored in a memory or the like (not shown), and secondary electrons corresponding to the irradiation positions are detected on the basis of the scanning information stored in the memory. In this manner, detected secondary electrons are obtained as pieces of one-dimensional information. Further, pieces of detected secondary electron information are rearranged as two-dimensional information, in accordance with the irradiation order and irradiation positions, thereby to obtain two-dimensional image information.

Of course, the detection of secondary electrons may be carried out in the same manner as that in the first embodiment.

In the case where the sample surface is randomly scanned with the charge beam, irradiation areas of respective beams randomly irradiated on the sample need not always be dot-like ones. For example, the beam can have any shape like a rectangular or circular beam or the like, as long as the beam has an irradiation area which is sufficiently smaller than the size of every mark formed on the sample.

The present invention is not limited to the above embodiments. Although the second embodiment shows a case where the misalignment measurement directions are set vertical to the electron beam scanning directions, the present invention is not limited thereto. As long as an angle close to a vertical angle exists, substantially the same effects as those of this embodiment can be attained. Even in case of not being vertical, the influence on offsets can be much more reduced than in the case of being parallel, although the effect of reducing the influence on offsets may be weakened.

In addition, the above explanation has taught the case where the electron beam for obtaining a signal waveform is operated to scan in only one direction. The present invention, however, is not limited thereto but is applicable to a case of bi-directional scanning.

Further, the above explanation has also taught the case where the present invention is applied to a misalignment inspection method. However, the present invention is naturally not limited thereto. For example, the present invention is applicable to position-aligned charge beam exposure as follows. That is, scanning with a charge beam in a misalignment inspection may be carried out by a charge beam exposure device, to obtain relative positions of first and second marks, and beam irradiation positions of the exposure device are corrected, to carry out pattern exposure.

Also, the shapes of marks formed on the sample are not limited to those of the above embodiments. Misalignment inspection can also be achieved with use of various shapes such as a square pattern and the like. In addition, the type of material the marks are made of is not limited but a different insulation film may be used in place of the TEOS layer 3 or the $SiO_2$ layer 1'.

As has been specifically explained above, more precise misalignment measurement can be achieved according to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A misalignment inspection method comprising:
   a step of scanning an area with a charge beam, the area including a part of first and second marks in a sample including the first mark and the second mark which is formed in a layer upper than the first mark and is used for measuring a relative position relative to the first mark, on a substrate, and the first and second mark being arranged so as not to have an area overlapping each other in a measurement direction in which relative positions of the first and second marks are measured;
   a step of detecting first charged particles from the sample on a first line including the first mark;
   a step of detecting second charged particles from the sample on a second line including the second mark;
   a step of obtaining representative points of the first and second marks, based on signal waveforms obtained from the first and second charged particles, respectively; and
   a step of calculating a positional misalignment amount of the first and second marks, based on the representative points of the first and second marks.

2. The method according to claim 1, wherein a flat layer having a flat surface is formed on the substrate including the first mark, the second mark is formed on the flat layer, and the second mark is exposed from a surface of the sample.

3. The method according to claim 1, wherein the charge beam is operated so as to scan, tracing a plurality of scanning tracks parallel to each other, in one same direction on each of the scanning tracks.

4. The method according to claim 1, wherein the charge beam is operated so as to scan, tracing a plurality of scanning tracks parallel to each other, such that adjacent ones of the scanning tracks are scanned in directions opposite to each other.

5. The method according to claim 1, wherein the charge beam is irradiated randomly on a surface of the sample.

6. The method according to claim 1, wherein the step of the scanning with the charge beam is a step of irradiating a charge beam having an irradiation sufficiently smaller than each of the first and second marks, randomly on a surface of the sample.

7. The method according to claim 1, wherein the charge beam is irradiated under condition that an emission efficiency of secondary electrons from a surface of the sample with respect to an amount of charged particles irradiated on the sample is not 1.

8. The method according to claim 1, wherein the charge beam is irradiated under condition that an emission efficiency of secondary electrons from a surface of the sample with respect to an amount of charged particles irradiated on the sample is lower than 1.

9. The method according to claim 1, wherein the charge beam is irradiated under condition that an emission efficiency of secondary electrons from a surface of the sample with respect to an amount of charged particles irradiated on the sample is higher than 1.

10. A charge beam exposure method comprising:
    a step of scanning an area with a charge beam by a charge beam exposure device, the area including a part of first and second marks in a sample including the first mark and the second mark which is formed in a layer upper than the first mark and is used for measuring relative positions of the first and second marks, on a substrate, and the first and second mark being arranged so as not to have an area overlapping each other in a measurement direction in which the relative positions of the first and second marks are measured;
    a step of detecting first charged particles from the sample on a first line including the first mark;
    a step of detecting second charged particles from the sample on a second line including the second mark;
    a step of obtaining representative points of the first and second marks, based on signal waveforms obtained from the first and second charged particles, respectively;
    a step of calculating a positional misalignment amount of the first and second marks, based on the representative points of the first and second marks; and
    a step of performing position-aligned exposure based on the positional misalignment amount of the first and second marks.

11. A misalignment inspection method comprising:
    a step of scanning an area with a charge beam, the area including a part of first and second marks in a sample including the first mark and the second mark which is formed in a layer upper than the first mark and is used for measuring relative positions of the first and second marks, on a substrate, by operating the charge beam in a direction vertical to a measurement direction in which relative positions of the first and second marks are measured, thereby to detect charged particles and to obtain a signal waveform as a positional function;
    a step of respectively detecting representative positions of the first and second marks, based on the signal waveform; and
    a step of calculating a positional misalignment amount of the first and second marks, based on the representative positions of the first and second marks.

12. The method according to claim 11, wherein a flat layer having a flat surface is formed on the substrate including the first mark, the second mark is formed on the flat layer, and the second mark is exposed from a surface of the sample.

13. The method according to claim 11, wherein the scanning with the charge beam and detection of the charged particles are carried out by a scanning microscope which scans with a charge beam in one single direction.

14. The method according to claim 11, wherein the charge beam is irradiated under condition that an emission efficiency of secondary electrons from a surface of the sample with respect to an amount of charged particles irradiated on the sample is not 1.

15. The method according to claim 11, wherein the charge beam is irradiated under condition that an emission efficiency of secondary electrons from a surface of the sample with respect to an amount of charged particles irradiated on the sample is lower than 1.

16. The method according to claim 11, wherein the charge beam is irradiated under condition that an emission efficiency of secondary electrons from a surface of the sample with respect to an amount of charged particles irradiated on the sample is higher than 1.

17. A charge beam exposure method comprising:

a step of scanning an area with a charge beam by a charge beam exposure device, the area including a part of first and second marks in a sample including the first mark and the second mark which is formed in a layer upper than the first mark and is used for measuring a relative position relative to the first mark, on a substrate, by operating the charge beam in a direction vertical to a measurement direction in which relative positions of the first and second marks are measured, thereby to detect charged particles and to obtain a signal waveform as a positional function;

a step of respectively detecting representative positions of the first and second marks, based on the signal waveform;

a step of calculating a positional misalignment amount of the first and second marks, based on the representative positions of the first and second marks; and a step of performing position-aligned exposure based on the calculated position misalignment amount of the first and second mark.

18. A substrate for pattern observation, comprising:

a first mark; and a second mark formed in a layer upper than the first mark and used for measuring a relative position relative to the first mark, wherein the first and second marks are arranged such that the first and second marks do not have an area where the first and second marks overlap each other in a measurement direction in which relative positions of the first and second marks are measured.

19. The substrate according to claim 18, wherein the first and second marks each have a line pattern portion, and the measurement direction of the relative positions is set in a line width direction of the line pattern.

20. The substrate according to claim 18, wherein the first and second marks each have a line pattern portion, and do not an overlapping area in a line length direction thereof.

* * * * *